(12) United States Patent
Greiser et al.

(10) Patent No.: US 10,254,372 B2
(45) Date of Patent: Apr. 9, 2019

(54) METHOD FOR RECORDING MAGNETIC RESONANCE DATA AND MAGNETIC RESONANCE DEVICE

(71) Applicants: Andreas Greiser, Erlangen (DE); Maria Kröll, Erlangen (DE); Dominik Paul, Bubenreuth (DE); Steffen Schröter, Fürth (DE); Jens Thöne, Lauf an der Pegnitz (DE)

(72) Inventors: Andreas Greiser, Erlangen (DE); Maria Kröll, Erlangen (DE); Dominik Paul, Bubenreuth (DE); Steffen Schröter, Fürth (DE); Jens Thöne, Lauf an der Pegnitz (DE)

(73) Assignee: Siemens Healthcare GmbH, Erlangen (DE)

( * ) Notice: Subject to any disclaimer, the term of this patent is extended or adjusted under 35 U.S.C. 154(b) by 153 days.

(21) Appl. No.: 15/260,535

(22) Filed: Sep. 9, 2016

(65) Prior Publication Data
US 2017/0082716 A1    Mar. 23, 2017

(30) Foreign Application Priority Data
Sep. 21, 2015   (DE) .................. 10 2015 218 086

(51) Int. Cl.
*G01V 3/00* (2006.01)
*G01R 33/567* (2006.01)
*G01R 33/28* (2006.01)
*G01R 33/341* (2006.01)

(52) U.S. Cl.
CPC ....... *G01R 33/5673* (2013.01); *G01R 33/283* (2013.01); *G01R 33/341* (2013.01)

(58) Field of Classification Search
CPC ................................. G01R 33/5673
USPC ...................... 324/306, 307, 309
See application file for complete search history.

(56) References Cited

U.S. PATENT DOCUMENTS

| 8,214,012 | B2 * | 7/2012 | Zuccolotto ........... A61B 5/0555 324/306 |
| 9,717,461 | B2 * | 8/2017 | Yu ........................... A61B 5/721 |
| 2009/0209846 | A1 | 8/2009 | Bammer |
| 2012/0283548 | A1 | 11/2012 | Greiser |

(Continued)

FOREIGN PATENT DOCUMENTS

| DE | 102011075289 A1 | 11/2012 |
| DE | 102012217283 A1 | 3/2014 |

OTHER PUBLICATIONS

German office Action for related German Application No. 10 2015 218 086.7 dated Apr. 14, 2016, with English Translation.

*Primary Examiner* — Louis Arana
(74) *Attorney, Agent, or Firm* — Lempia Summerfield Katz LLC

(57) ABSTRACT

A method is provided for recording, with a magnetic resonance device, magnetic resonance data of a target region of a patient moved by their breathing. An optical camera arranged in a bore of the magnetic resonance device directed onto the patient is used. Image data of the patient recorded by the camera before and/or during the recording of the magnetic resonance data is evaluated to form breathing information describing the breathing state and the breathing information is used for triggering and/or movement correction and/or assessment of a process in which a patient holds their breath.

16 Claims, 3 Drawing Sheets

(56) References Cited

U.S. PATENT DOCUMENTS

2013/0274590 A1\* 10/2013 Auboiroux ............... A61N 7/02
                                                                            600/411
2015/0091563 A1    4/2015 Lu et al.
2016/0331239 A1\* 11/2016 Maclaren ............... A61B 5/055

\* cited by examiner

METHOD FOR RECORDING MAGNETIC RESONANCE DATA AND MAGNETIC RESONANCE DEVICE

This application claims the benefit of DE 10 2015 218 086.7, filed on Sep. 21, 2015, which is hereby incorporated by reference in its entirety.

TECHNICAL FIELD

The embodiments relate to a method for recording, with a magnetic resonance device, magnetic resonance data of a target region moved by the breathing of a patient and to a magnetic resonance device.

BACKGROUND

Magnetic resonance imaging may be suited to so-called soft tissue imaging, since different types of tissue may be clearly distinguished within a patient, hence a high soft tissue contrast is present. Therefore, magnetic resonance imaging is frequently used to perform examinations in the region of the upper body of a patient, for example, abdomen and/or heart examinations.

A challenge that presents itself in the recording of magnetic resonance images in the region of the upper body is the breathing of the patient. If the target region to be imaged is moved by the breathing, movement artifacts, which make the resulting image quality much worse, may be produced as a result of the breathing. Thus, methods have already been proposed for avoiding or for reducing such movement artifacts.

In such cases on the one hand recording the magnetic resonance data during a breath-holding process of the patient is known, e.g., in a state in which the patient is holding their breath. To this end, it is known that breathing commands may be issued to the patient located within the bore of the magnetic resonance device, for example via special headphones or optically, wherein it is assumed that said patient will carry out these commands. Here, however, the cooperation of the patient must also be insured, wherein additionally it only becomes evident on viewing the reconstructed images whether the magnetic resonance data has actually been recorded in a breath-holding state, e.g., during a breath-holding process.

It has further been proposed to use a breath signal, (e.g., breathing information), to carry out the recording of the magnetic resonance data in a triggered fashion in specific sections of the breathing cycle. To establish the breath signal, there may be provision on the one hand for a so-called navigator, therefore a low-dimensional image recording of a contrast edge in the patient moving because of the breathing, (e.g., a restriction of the diaphragm), to be recorded and evaluated by the magnetic resonance imaging. It is also conceivable to use dedicated breath sensors, for example, a respiration belt, a chest belt, a breath sensor built into the patient couch, and the like. Breath information describing the current breathing state may be established both from navigators and also from the sensor data of a breath sensor, so that the recording of the magnetic resonance data or of a part of the magnetic resonance data in each case, may be triggered when the same breathing state is present, for example, during complete expiration. In relation to the use of navigators, an extremely complicated positioning of the navigator and a clear contrast is required, which isn't always ideal and easily possible. Sensors represent additional objects in the imaging region, (e.g., in the homogeneity volume), of the magnetic resonance device, e.g., further reduce the already small space in the bore and may possibly disrupt the recording of the magnetic resonance data.

Methods for movement correction of magnetic resonance data that may use such breathing information for example have also already been proposed, wherein the use of such methods is less preferred with the breathing information described, since this cannot describe the movement in the actual target region sufficiently accurately.

SUMMARY AND DESCRIPTION

The scope of the present invention is defined solely by the appended claims and is not affected to any degree by the statements within this summary. The present embodiments may obviate one or more of the drawbacks or limitations in the related art.

The object is therefore to specify a simple-to-realize possibility, which takes breathing into account, for recording magnetic resonance data.

To achieve this object, there is provision for a method of the type stated at the outset, which is characterized by the use of an optical camera arranged in a bore of the magnetic resonance device, directed onto the patient, wherein image data of the patient recorded by the camera before and/or during the recording of the magnetic resonance data is evaluated to form breathing information describing the breathing state and the breathing information is used for triggering and/or movement correction and/or assessment of a process in which a patient holds their breath.

Thus, the embodiments propose to resolve the described problem of breath-controlled magnetic resonance imaging or magnetic resonance imaging influenced by the breathing by an optical camera that is located in the bore of the magnetic resonance device and records the breathing movement of the patient in image data. Such optical imaging devices, also referred to as in-bore cameras, have already been proposed for monitoring movements of the head during head imaging. The cameras are accordingly designed to be magnetic-resonance-compatible and may be arranged for example on and/or in internal cladding of the bore, but may also be arranged on devices located inside the bore, for example on housings of a head coil and the like. The camera may be arranged so that it captures the recording region, (e.g., the homogeneity volume), hence also the target region and surrounding regions of the patient arranged there. If magnetic resonance data of a target region on the upper body of the patient is to be recorded, the chest cavity or objects arranged thereon, (e.g., moved by the breathing), is/are captured and may be detected in the image data.

By image evaluation, which may be done, for example, by an image processing unit of a control device of the magnetic resonance device, breathing movements on the patient are able to be determined and hence breathing information that describes the current breathing state may be inferred, which may be used for triggering and/or for assessment of a process in which a patient holds their breath.

One of the advantages is that an in-bore camera that is present in any event may also be used for monitoring the breathing or sequence control in the recording of magnetic resonance data under free breathing. The value of the camera built into the bore increases through the additional application. In addition, breath sensors, (e.g., further hardware components), may be avoided. In such cases, the camera as "hardware" may be expanded accordingly in its functionality at the software level, hence, e.g., within the framework of image processing, in order to carry out or to monitor breathing-controlled recording.

The breathing information may be established by a localization and tracing of a surface of the patient moved by the breathing and/or an object arranged on a surface of the patient moved by the breathing. It may be advantageous when the observed surface is the chest cavity of the patient, which rises and falls during the course of breathing. If an object is arranged on the chest cavity of the patient, (e.g., a local coil), this movement is transmitted to the object resting on the corresponding surface, so that its movement may hence also be followed.

The surfaces of the patient, (e.g., of the chest cavity), moved by the breathing may be found, for example, by using a patient model within the framework of image processing. It is also possible to use optically-detectable markers positioned on the patient, which make it easier to find the moved surface. It is also possible, within the framework of image processing, to analyze movement patterns in the image data over the course of time. For example, there may be an evaluation of movement patterns in the image data in respect of its periodicity over time, wherein a specific frequency range is known for the breathing movement. To follow the movement, a surface segment may expediently be selected that has the greatest amplitude of the periodic breathing movement in accordance with the image data. Naturally, combinations of these options are also conceivable within the framework of the image processing. Image processing methods that allow points/objects to be followed in chronologically sequential images are likewise already known in the prior art and may also be used in accordance with the embodiments disclosed herein.

It may be expedient in this context for the camera to be a three-dimensional (3D) camera, (e.g., a time-of-flight camera), and for the distance between the camera and the surface and/or the object over time to be evaluated for establishing the breathing information. As an alternative to a 3D camera, distance information may also be established by using a number of cameras arranged at different locations as well as by optical flow methods. The time-of-flight method may be used for establishing the distance from the moved surface or from the object placed thereon to describe the breathing movement. A periodic distance change is then produced, which maps the corresponding breathing movement of the patient and may be easy to interpret.

In a first form of embodiment, the breathing information may be used for triggering the recording of at least a part of the magnetic resonance data, e.g., of a slice. Thus, the direct recognition of the breathing movement by the camera is used, in order to determine the presence of a specific breathing state, (e.g., full expiration), in order to start the recording of the magnetic resonance data, e.g., of a part of the magnetic resonance data that may be recorded in the expected period of time in which the breathing state differs only slightly from the trigger breathing state. Consequently, a control device that has established the breathing information checks the presence of the trigger breathing state and creates a trigger signal that initiates the recording in the correct breathing state.

A further advantageous embodiment makes provision that, if an interrupted breath-holding process is identified during the recording of magnetic resonance data, a message is output to an operator and/or the magnetic resonance data recorded during the interruption of the breath holding is marked and/or discarded. It is hence also possible to monitor whether the patient is actually holding their breath for the entire time during the recording of the magnetic resonance data, as desired, or whether the breath-holding state is being interrupted. If the patient breathes before the end of the measurement, as a result of illness-related limitations of the breathing organs, for example, corresponding information may be output as a message to the operator.

In certain embodiments, discarded or marked magnetic resonance data may be measured again, triggered completely automatically after breath holding has been re-established. This provides that the breathing information may also be used to automatically trigger the re-imaging of entire slices or other portions of the magnetic resonance data that were established during an interruption in the breath-holding process.

In general, but also in this context, it may be advantageous, if an interruption of a breath-holding process is identified during the recording of magnetic resonance data, for the breathing information present during the breath-holding process to be stored, and when the same or a comparable breathing state is restored, to be employed as a comparison to the current breathing information. This provides that the breathing state that existed while the breath was being held, described by the corresponding breathing information, may be stored and used as reference state or then reference information, in order, at a later point in time, for example, to repeat the recording of discarded and/or marked magnetic resonance data, to restore the same breathing state, e.g., the reference state. For example, as a function of a deviation of the current breathing information from the reference information, instructions may be output to the patient, which guide the latter as simply as possible to re-establishing the reference state.

As well as the method, a magnetic resonance device is also provided, the device having a bore with an optical camera arranged in the bore and a control device having an image-processing device that is embodied for carrying out the method. All statements made in relation to the method may be transferred analogously to the magnetic resonance device, with which the advantages already stated may hence likewise be obtained.

It may also be pointed out here that the method described here is able to be used for both open and closed magnetic resonance devices. In certain embodiments, the method is used in so-called closed magnetic resonance devices, in which the bore is formed by a cylindrical hole in a main magnet unit.

BRIEF DESCRIPTION OF THE DRAWINGS

Further advantages and details emerge from the exemplary embodiments described below, as well as with reference to the drawings, in which.

DETAILED DESCRIPTION

Figure 1:
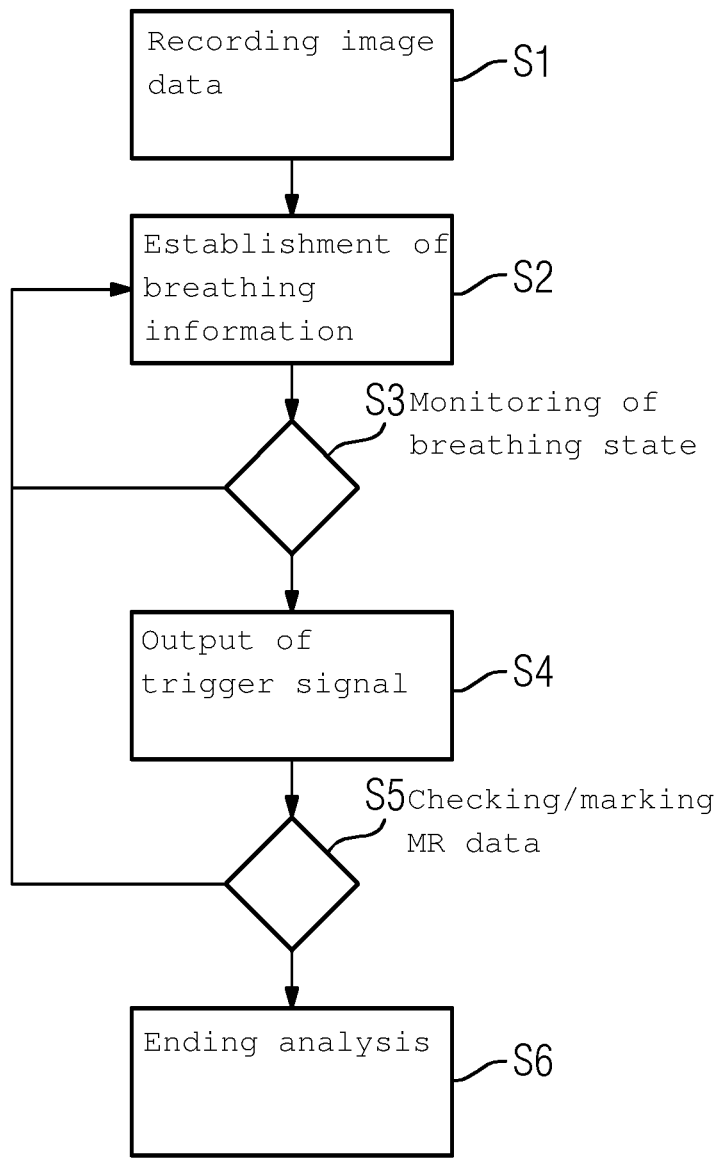
FIG. 1 depicts a flowchart of a first exemplary embodiment of the method.

In the exemplary embodiments described below, magnetic resonance data of a target region of the patient moved by their breathing is to be recorded as free from artifacts as possible. For this purpose, it is assumed that the patient is already placed on a patient couch within the bore at the beginning of the method, that the target region, (e.g., the heart or the abdomen region), is located in the homogeneity area of the magnetic resonance device.

In a first exemplary embodiment, in act S1, even before the actual recording of the magnetic resonance data, image data is recorded with a 3D camera arranged in the magnetic resonance device directed to the homogeneity volume. By evaluating this image data, this serves to initialize the establishment of breathing information from image data still recorded thereafter. To this end, image processing of the image data therefore takes place in act S1, the objective of which is to identify a surface of the patient or an object placed thereon moved by their breathing, which is therefore moved at the same time, and to follow it as the method progresses. In this case, different ways of proceeding are conceivable, which may also be employed in combination. Thus, the chest cavity serves as the surface of the patient that may be found by the patient model and corresponding object recognition algorithms, possibly also by using background knowledge for positioning of the patient in the magnetic resonance device. If necessary, the camera may also be registered with the coordinate system of the magnetic resonance device, so that a position of the chest cavity of the patient found in a localizer for example from magnetic resonance data may be found again in the image data of the camera or at least finding it may be assisted. If an object, (e.g., a local coil), is resting on the patient, (e.g., on the chest cavity), this may naturally also be found by an object classification. The camera used here involves a 3D camera, so that in particular distances to the individual features visible in the image may be established. To this end, the time-of-flight method is used here. This may make it possible to analyze the courses of distances for different features in the image data, for example, as to whether the frequency of the periodic movement defined there lies within a reference frequency band for possible breathing movements. The corresponding moved surfaces may then be sorted according to the amplitude of the periodic movement, wherein, for example, the surface with the highest movement amplitude, which will mostly be given by the chest cavity, may be followed for establishing the breathing states. Once the moved surface to be followed or the moved object to be followed is known, the distance in the corresponding image area may be constantly monitored and hence delivers breathing information that describes the current breathing state during the breathing cycle.

Act S2 indicates the continuous establishment of the breathing information from the image data of the camera that now follows.

In act S3, the breathing information is now monitored as to whether a specific, desired breathing state, (e.g., maximum expiration), is produced sufficiently accurately. If this is the case, a trigger signal is output, which leads, in act S4, provided the corresponding breathing state is expected in specific tolerance ranges, which may be established for example from an evaluation of the previously recorded breathing information covering a number of breathing cycles, or the breathing information does not show any breathing state lying outside the tolerance range, to magnetic resonance data of the patient being recorded. In this case, it is not necessary to record all the magnetic resonance data needed during a single recording section, so that, in act S5, a check is made as to whether all the magnetic resonance data needed has already been recorded, e.g., whether all slices have been measured. If this is not the case there is further monitoring in act S2 as to whether the desired breathing state is occurring, so that further magnetic resonance data, (e.g., further slices), may be recorded in a triggered fashion. If all magnetic resonance data has been recorded, the method is ended in act S6.

Figure 2:
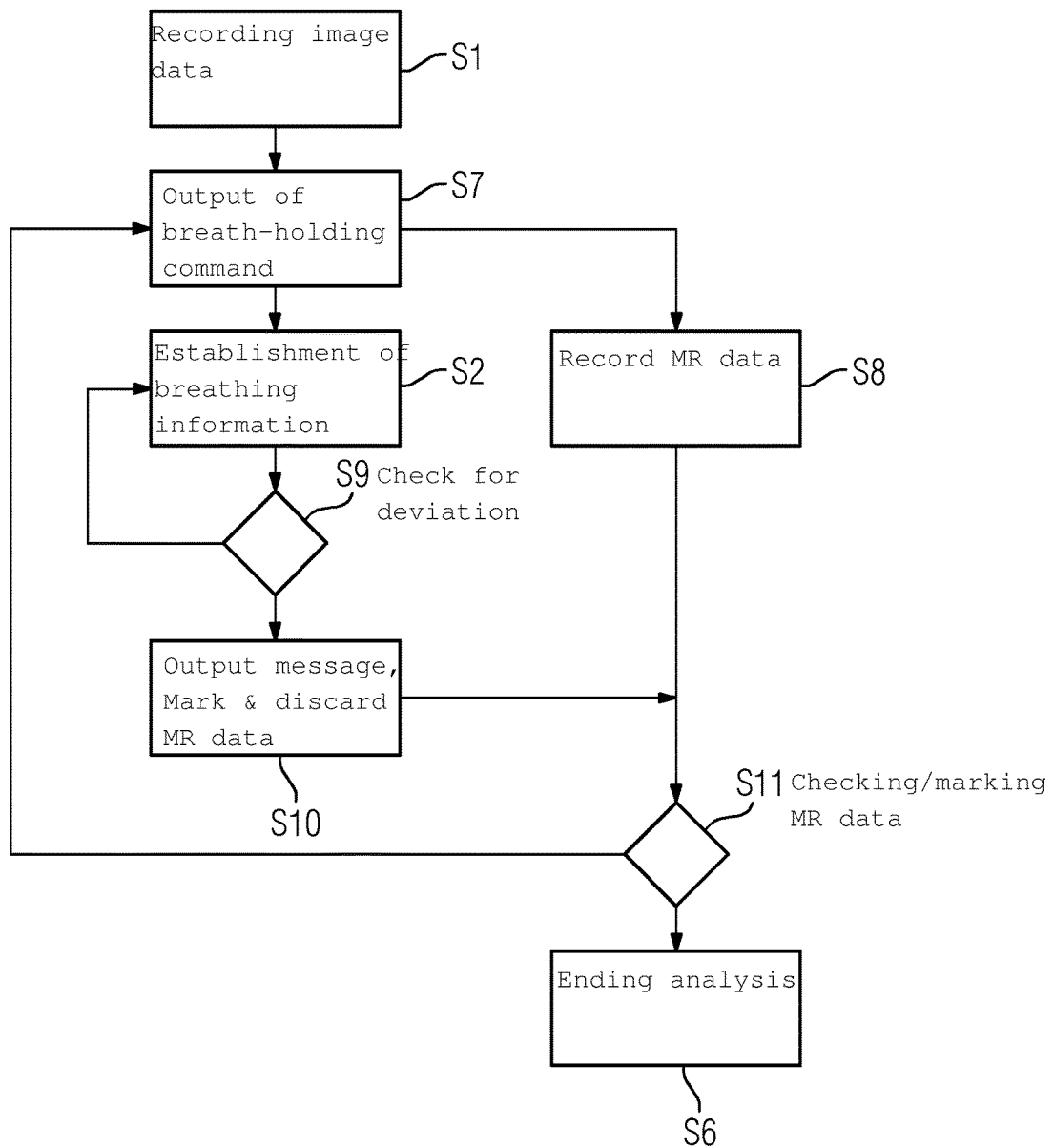
FIG. 2 depicts a flowchart of a second exemplary embodiment of the method.

In the exemplary embodiment of FIG. 2, after the initialization in act S1, which corresponds to the first exemplary embodiment, in act S7, at least one command is output to the patient to hold their breath, which leads to the setting of a specific, desired breathing state for the recording of the magnetic resonance data, which is also to be referred to below as the reference state. The recording of the magnetic resonance data is begun in act S8. In parallel to the recording of the magnetic resonance data, in act S2, the breathing information continues to be established, wherein the breathing state present after the breath-holding command in act S7, described by the breathing information measured at that point, is stored, so that the corresponding breathing information forms reference information.

In act S9, a check is then made as to whether the current breathing information deviates from the reference information outside a tolerance range, hence whether the breath-holding process has been interrupted by the patient. If this is not the case, the monitoring is continued in act S2, as is the recording of magnetic resonance data. If, however, it is determined that the breath-holding process is interrupted, and hence the reference state of the breathing is no longer given, then in a present exemplary embodiment, in act S10, a number of measures are taken. On the one hand, a message about holding the breath being discontinued is output to an operator. At the same time, however, the magnetic resonance data recorded during the absence of the reference state is marked and discarded. The recording process is interrupted.

In act S11, a check is then made in any event as whether all desired magnetic resonance data has already been recorded or whether, if all magnetic resonance data is present, magnetic resonance data is marked. If this is the case, an attempt is made, by renewed breathing commands in act S7, to re-establish the reference state as accurately as possible, after which, in act S8, under further, renewed monitoring in act S2, the marked or still missing magnetic resonance data may be recorded. As soon as all magnetic resonance data recorded in the reference state is present, the method is ended in act S6.

Figure 3:
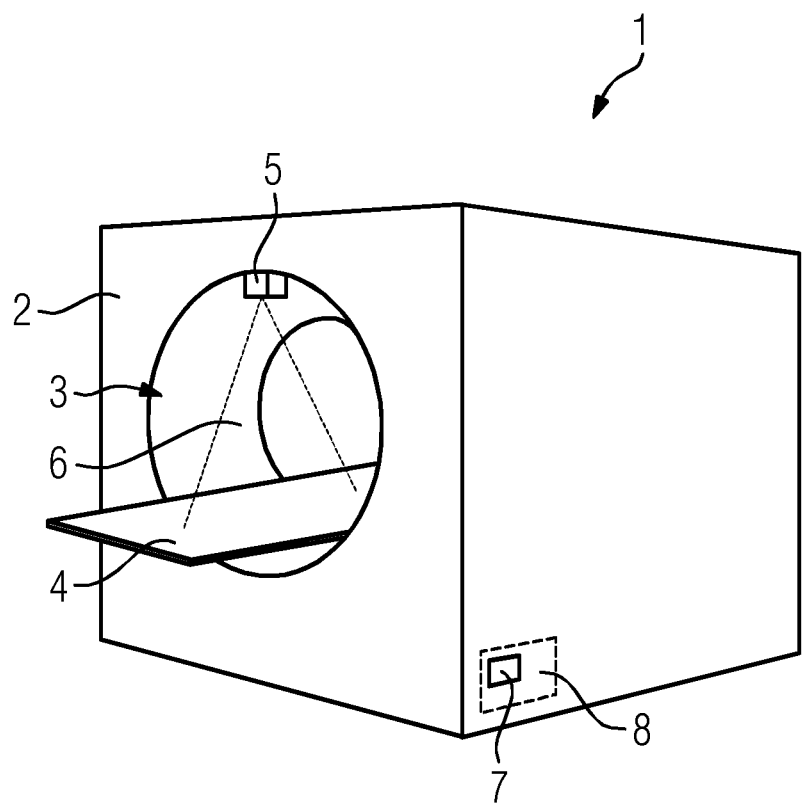
FIG. 3 depicts an example of a magnetic resonance device.

Finally, FIG. 3 depicts a schematic diagram of a magnetic resonance device 1, which in the present case has a main magnet unit 2, in which the magnet creating the basic magnetic field is arranged. A cylindrical bore 3 is provided in the main magnet 2, surrounding which, as is basically known, a radio-frequency coil arrangement and a gradient coil arrangement may be provided. A patient not depicted here in any greater detail may be moved into the bore 3 by a patient couch 4.

Arranged on a cladding of the bore 3 here is a 3D camera 5, here a time-of-flight (TOF) camera, of which the capture area 6 includes at least the homogeneity volume of the magnetic resonance device 1.

Image data recorded by the camera 5 is transmitted to an image processing unit 7 of a control device 8 of the magnetic resonance device 1. The control device 8 is embodied to carry out the method, however it also makes possible further applications of the image data of the camera 5, for example for following the movement of a head.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for recording, with a magnetic resonance device, magnetic resonance data of a target region of a patient moved by breathing of the patient, the method comprising:
   recording image data of the patient using an optical camera arranged in a bore of the magnetic resonance device directed onto the patient;
   evaluating the image data of the patient before, during, or before and during the recording of the magnetic resonance data to form breathing information describing a breathing state, wherein the breathing information is established by a localization and following of an object arranged on a surface of the patient moved by the breathing; and
   using the breathing information for triggering a recording of magnetic resonance data, a movement correction, an assessment of a process in which the patient holds their breath, or a combination thereof.

2. The method of claim 1, wherein the object is a local coil.

3. The method of claim 2, wherein the camera is a three-dimensional camera, and
   wherein a distance from the camera to the object is evaluated over time for establishing the breathing information.

4. The method of claim 3, wherein the breathing information is used for triggering the recording of at least a part of the magnetic resonance data.

5. The method of claim 4, wherein, when an interrupted breath-holding process is identified during the recording of the magnetic resonance data, the method further comprises:
   outputting a message to an operator, marking and/or discarding magnetic resonance data recorded during the interrupted breath-holding process, or a combination thereof.

6. The method of claim 5, further comprising:
   storing the breathing information present during the interrupted breath-holding process; and
   including a comparison to current breathing information when a same or a comparable breathing state is restored.

7. The method of claim 1, wherein the camera is a three-dimensional camera, and
   wherein a distance from the camera to the object is evaluated over time for establishing the breathing information.

8. The method of claim 1, wherein, when an interrupted breath-holding process is identified during the recording of the magnetic resonance data, the method further comprises:
   outputting a message to an operator, marking and/or discarding magnetic resonance data recorded during the interruption of the breath-holding, or a combination thereof.

9. The method of claim 1, wherein the breathing information is used for triggering the recording of at least a part of the magnetic resonance data.

10. The method of claim 9, wherein the part of the magnetic resonance data is a slice.

11. The method of claim 1, wherein, when an interrupted breath-holding process is established during the recording of the magnetic resonance data, the method further comprises:
    storing the breathing information present during the interrupted breath-holding process; and
    including a comparison to current breathing information when a same or a comparable breathing state is restored.

12. A method for recording, with a magnetic resonance device, magnetic resonance data of a target region of a patient moved by breathing of the patient, the method comprising:
    recording image data of the patient using an optical camera arranged in a bore of the magnetic resonance device directed onto the patient;
    evaluating the image data of the patient before, during, or before and during the recording of the magnetic resonance data to form breathing information describing a breathing state;
    using the breathing information for triggering a recording of magnetic resonance data, a movement correction, an assessment of a process in which the patient holds their breath, or a combination thereof;
    identifying an interrupted breath-holding process during the recording of the magnetic resonance data; and
    outputting a message to an operator, marking and/or discarding magnetic resonance data recorded during the interrupted breath-holding process, or a combination thereof.

13. The method of claim 12, further comprising:
    storing the breathing information present during the interrupted breath-holding process; and
    including a comparison to current breathing information when a same or a comparable breathing state is restored.

14. The method of claim 12, further comprising:
    remeasuring the marked and/or the discarded magnetic resonance data in a triggered fashion fully automatically after restoration of the breath holding.

15. The method of claim 14, further comprising:
    storing the breathing information present during the interrupted breath-holding process; and
    including a comparison to current breathing information when a same or a comparable breathing state is restored.

16. A magnetic resonance device comprising:
    a bore having an optical camera arranged in the bore;
    a control device having an image processing unit, wherein, the control device is configured to, with the bore, cause the magnetic resonance device to at least perform:
       record image data of a patient using the optical camera arranged in the bore directed onto the patient,
       evaluate the image data of the patient before, during, or before and during a recording of magnetic resonance data to form breathing information describing a breathing state of the patient;
       use the breathing information for triggering a recording of magnetic resonance data, a movement correction, an assessment of a process in which the patient holds their breath, or a combination thereof;

identify an interrupted breath-holding process during the recording of the magnetic resonance data; and output a message to an operator, mark and/or discard magnetic resonance data recorded during the interrupted breath-holding process, or a combination thereof.

\* \* \* \* \*